United States Patent
Kusuda

(10) Patent No.: US 10,576,589 B2
(45) Date of Patent: Mar. 3, 2020

(54) COOLING SYSTEM FOR USE WITH A POWER ELECTRONICS ASSEMBLY AND METHOD OF MANUFACTURING THEREOF

(71) Applicant: The Boeing Company, Huntington Beach, CA (US)

(72) Inventor: Charles E. Kusuda, Mukilteo, WA (US)

(73) Assignee: The Boeing Company, Chicago, IL (US)

( * ) Notice: Subject to any disclaimer, the term of this patent is extended or adjusted under 35 U.S.C. 154(b) by 355 days.

(21) Appl. No.: 14/501,683

(22) Filed: Sep. 30, 2014

(65) Prior Publication Data
US 2016/0095248 A1    Mar. 31, 2016

(51) Int. Cl.
*B23P 15/26*    (2006.01)
*H05K 7/20*    (2006.01)

(52) U.S. Cl.
CPC .......... *B23P 15/26* (2013.01); *H05K 7/20681* (2013.01)

(58) Field of Classification Search
CPC ... F28F 7/00; F28F 15/00; H05K 7/20; H05K 7/2029; H05K 5/00; H05K 7/20145; H05K 7/20254; H05K 7/20272; H05K 7/20309; H05K 7/20318; H05K 7/20345; B23P 15/26
USPC .......... 165/80.2, 80.4, 80.5, 104.21, 104.26, 165/80.1, 104.19, 185; 361/700, 699, 709
See application file for complete search history.

(56) References Cited

U.S. PATENT DOCUMENTS

| | | | |
|---|---|---|---|
| 7,184,269 B2 * | 2/2007 | Campbell | H05K 7/20781 165/104.33 |
| 7,187,549 B2 * | 3/2007 | Teneketges | H01L 23/473 165/104.33 |
| 7,885,070 B2 * | 2/2011 | Campbell | H05K 7/203 361/699 |
| 7,921,664 B2 * | 4/2011 | Rini | F25B 1/00 62/259.2 |
| 7,983,040 B2 * | 7/2011 | Campbell | H05K 7/20772 165/104.33 |
| 7,992,626 B1 * | 8/2011 | Tilton | F28F 13/185 165/104.26 |

(Continued)

FOREIGN PATENT DOCUMENTS

| | | |
|---|---|---|
| EP | 2631564 A1 | 8/2013 |
| EP | 2679765 A1 | 1/2014 |
| WO | 9743887 A1 | 11/1997 |

OTHER PUBLICATIONS

EP Extended Search Report for related application 15186925.2 dated Jun. 27, 2016; 7 pp.
(Continued)

*Primary Examiner* — Keith M Raymond
*Assistant Examiner* — Gustavo A Hincapie Serna
(74) *Attorney, Agent, or Firm* — Armstrong Teasdale LLP

(57) ABSTRACT

A cooling system for use with a power electronics assembly comprising an array of line-replaceable units is provided. The cooling system includes a first manifold coupled in flow communication with the array of line-replaceable units, and a fluid supply coupled in flow communication with the first manifold. The fluid supply is configured to channel cooling fluid towards the first manifold such that the cooling fluid is discharged towards the line-replaceable units in the array substantially simultaneously.

20 Claims, 3 Drawing Sheets

(56) References Cited

U.S. PATENT DOCUMENTS

| | | | | |
|---|---|---|---|---|
| 8,184,436 B2* | 5/2012 | Campbell | ........... | H05K 7/20809 165/104.21 |
| 8,351,206 B2* | 1/2013 | Campbell | ........... | H05K 7/20809 361/691 |
| 8,472,182 B2* | 6/2013 | Campbell | ........... | H05K 7/20781 361/679.49 |
| 9,042,098 B2* | 5/2015 | Campbell | ........... | H05K 7/20781 165/104.33 |
| 9,043,035 B2* | 5/2015 | Chainer | ........... | G05D 7/0635 700/282 |
| 9,420,728 B2* | 8/2016 | Desiano | ........... | H05K 7/20772 |
| 2004/0221604 A1* | 11/2004 | Ota | ........... | H05K 7/20781 62/259.2 |
| 2006/0002086 A1 | 1/2006 | Teneketges et al. | | |
| 2006/0026983 A1* | 2/2006 | Tilton | ........... | F28D 5/00 62/310 |
| 2006/0118292 A1* | 6/2006 | Weber | ........... | F25B 23/006 165/281 |
| 2006/0179861 A1 | 8/2006 | Weber et al. | | |
| 2007/0209782 A1* | 9/2007 | Wyatt | ........... | F28D 15/0266 165/76 |
| 2007/0227710 A1* | 10/2007 | Belady | ........... | H05K 7/2079 165/122 |
| 2007/0263356 A1 | 11/2007 | Weber et al. | | |
| 2008/0179044 A1* | 7/2008 | Hu | ........... | H01L 23/473 165/80.4 |
| 2010/0302729 A1 | 12/2010 | Tegart et al. | | |
| 2011/0075373 A1* | 3/2011 | Campbell | ........... | H05K 7/202 361/701 |
| 2012/0097370 A1* | 4/2012 | Correa | ........... | G06F 1/20 165/104.21 |
| 2012/0324933 A1* | 12/2012 | Louvar | ........... | H05K 7/20327 62/196.4 |
| 2013/0068441 A1* | 3/2013 | Campbell | ........... | H05K 7/20145 165/249 |
| 2013/0340996 A1* | 12/2013 | David | ........... | G05D 23/00 165/287 |
| 2014/0202678 A1* | 7/2014 | Goth | ........... | H05K 7/20772 165/287 |

OTHER PUBLICATIONS

Canada Office Action for related matter 2898306 dated Sep. 16, 2016; 3 pp.

Canadian Office Action Application No. 2898306, dated Sep. 14, 2017, 4 pages.

Examination Report regarding European Patent Application Serial No. 15186925.2 dated Apr. 1, 2019, pp. 1-6.

* cited by examiner

COOLING SYSTEM FOR USE WITH A POWER ELECTRONICS ASSEMBLY AND METHOD OF MANUFACTURING THEREOF

BACKGROUND

The field of the present disclosure relates generally to power electronics assemblies and, more specifically, to cooling systems for power electronics assemblies.

At least some known electronics systems, such as those included in avionics platforms, include an interface that supports a plurality of electronic components such as line-replaceable units (LRUs). A LRU is generally defined as a modular component capable of being quickly and easily interchangeable at the interface with a replacement component. During operation, LRUs generate heat that must be dissipated to ensure the LRUs continue to function properly for extended durations. At least some known cooling systems utilize cooling liquid to dissipate heat from the LRUs. For example, in a two-phase cooling system, cooling liquid is discharged towards the LRUs and the cooling fluid's latent heat of vaporization is used to cool the LRUs. In such systems, each LRU generally has its own dedicated cooling fluid supply assembly whose equipment size and cooling capability is selected based on a heat load generated by each associated LRU. As such, having each cooling fluid supply assembly tailored to each LRU increases equipment requirements, and thus increases the weight of an overall assembly, such as the avionics platform.

BRIEF DESCRIPTION

In one aspect, a cooling system for use with a power electronics assembly comprising an array of line-replaceable units is provided. The cooling system includes a first manifold coupled in flow communication with the array of line-replaceable units, and a fluid supply coupled in flow communication with the first manifold. The fluid supply is configured to channel cooling fluid towards the first manifold such that the cooling fluid is discharged towards the line-replaceable units in the array substantially simultaneously.

In another aspect, a power electronics assembly is provided. The assembly includes an array of line-replaceable units and a cooling system. The cooling system includes a first manifold coupled in flow communication with the array of line-replaceable units, and a fluid supply coupled in flow communication with the first manifold. The fluid supply is configured to channel cooling fluid towards the first manifold such that the cooling fluid is discharged towards the line-replaceable units in the array substantially simultaneously.

In yet another aspect, a method of manufacturing a cooling system for use with a power electronics assembly including an array of line-replaceable units is provided. The method includes coupling a first manifold in flow communication with the array of line-replaceable units, and coupling a fluid supply in flow communication with the first manifold. The fluid supply is configured to channel cooling fluid towards the first manifold such that the cooling fluid is discharged towards the line-replaceable units in the array substantially simultaneously.

DETAILED DESCRIPTION

The implementations described herein relate to cooling systems for use in dissipating heat from an array of electronic components, such as line-replaceable units (LRUs). Specifically, the implementations described herein include a centralized cooling system for the array of LRUs such that each LRU will not have its own self-contained cooling system. The cooling system includes a first manifold that enables cooling fluid to be discharged towards each LRU in the array substantially simultaneously, and a second manifold that collects the cooling fluid discharged towards each LRU. In one implementation, the cooling system is a closed-loop two-phase cooling system such that vaporized cooling fluid collected in the second manifold is channeled towards a single condenser. The condenser condenses the vaporized cooling fluid and replenishes the cooling fluid in the first manifold with the condensed cooling fluid.

Returning the heat laden vapor/liquid mixture to the condenser, wherein the heat is dissipated to a secondary fluid stream, enables lower ambient temperatures surrounding the centralized LRU installations to be utilized. This is beneficial when the cooling system is implemented in a vehicle. A second benefit of the centralized 2-phase system is reduced power consumption by pumps in the system when compared to pump and fan power requirements for single phase and air-based cooling systems. Moreover, the centralized 2-phase cooling system has higher reliability caused by robust redundant system components and reduced LRU complexity. As such, centralizing the cooling system for the array reduces cooling equipment requirements by not having to individually size equipment in self-contained cooling systems, thereby reducing the weight of an overall assembly.

Figure 1:
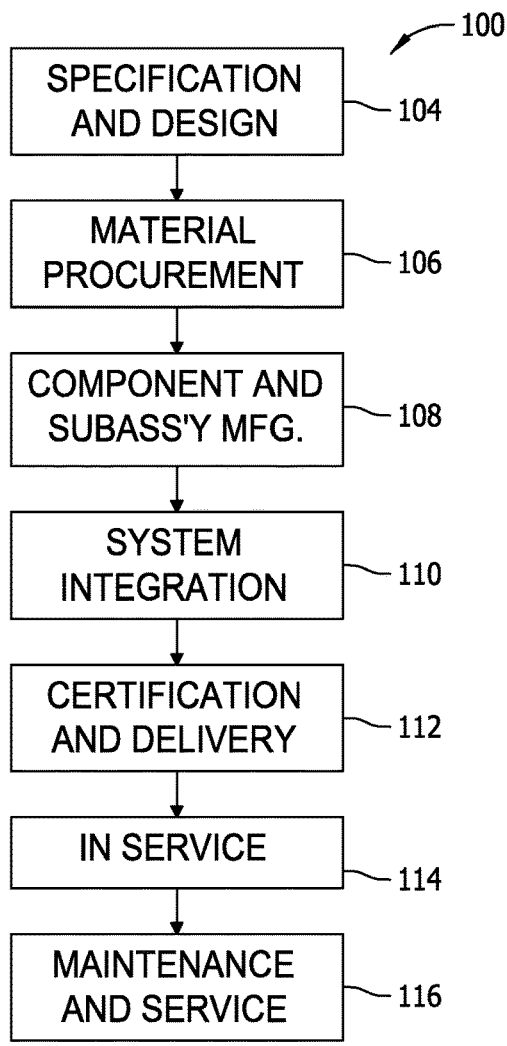
FIG. 1 is a flow diagram of an exemplary aircraft production and service method.
Figure 2:
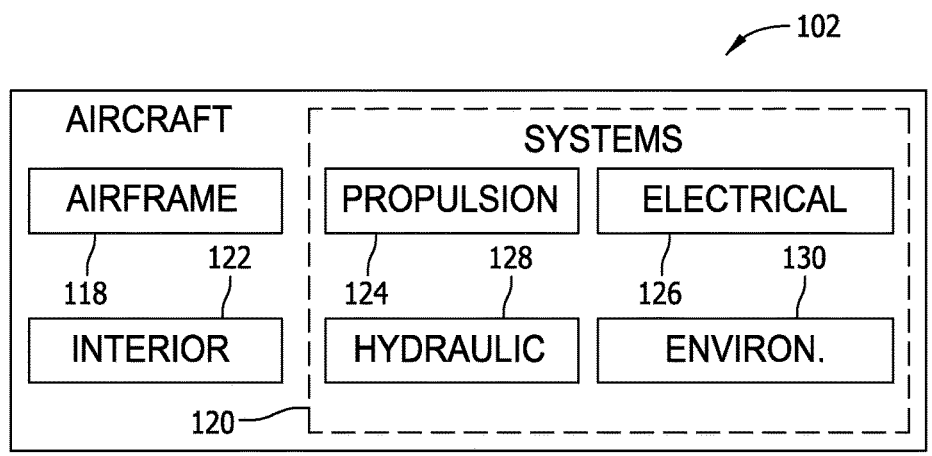
FIG. 2 is a block diagram of an exemplary aircraft.

Referring to the drawings, implementations of the disclosure may be described in the context of an aircraft manufacturing and service method 100 (shown in FIG. 1) and via an aircraft 102 (shown in FIG. 2). During pre-production, including specification and design 104 data of aircraft 102 may be used during the manufacturing process and other materials associated with the airframe may be procured 106. During production, component and subassembly manufacturing 108 and system integration 110 of aircraft 102 occurs, prior to aircraft 102 entering its certification and delivery process 112. Upon successful satisfaction and completion of airframe certification, aircraft 102 may be placed in service 114. While in service by a customer, aircraft 102 is scheduled for periodic, routine, and scheduled maintenance and service 116, including any modification, reconfiguration, and/or refurbishment, for example. In alternative implementations, manufacturing and service method 100 may be implemented via platforms other than an aircraft.

Each portion and process associated with aircraft manufacturing and/or service 100 may be performed or completed by a system integrator, a third party, and/or an operator (e.g., a customer). For the purposes of this description, a system integrator may include without limitation any number of aircraft manufacturers and major-system subcontractors; a third party may include without limitation any number of venders, subcontractors, and suppliers; and an operator may be an airline, leasing company, military entity, service organization, and so on.

As shown in FIG. 2, aircraft 102 produced via method 100 may include an airframe 118 having a plurality of systems 120 and an interior 122. Examples of high-level systems 120 include one or more of a propulsion system 124, an electrical system 126, a hydraulic system 128, and/or an environmental system 130. Any number of other systems may be included.

Apparatus and methods embodied herein may be employed during any one or more of the stages of method 100. For example, components or subassemblies corresponding to component and subassembly production process 108 may be fabricated or manufactured in a manner similar to components or subassemblies produced while aircraft 102 is in service 114. Also, one or more apparatus implementations, method implementations, or a combination thereof may be utilized during the production stages 108 and 110, for example, by substantially expediting assembly of, and/or reducing the cost of assembly of aircraft 102. Similarly, one or more of apparatus implementations, method implementations, or a combination thereof may be utilized while aircraft 102 is being serviced or maintained, for example, during scheduled maintenance and service 116.

As used herein, the term "aircraft" may include, but is not limited to only including, airplanes, unmanned aerial vehicles (UAVs), gliders, helicopters, and/or any other object that travels through airspace. Further, in an alternative implementation, the aircraft manufacturing and service method described herein may be used in any manufacturing and/or service operation.

Figure 3:
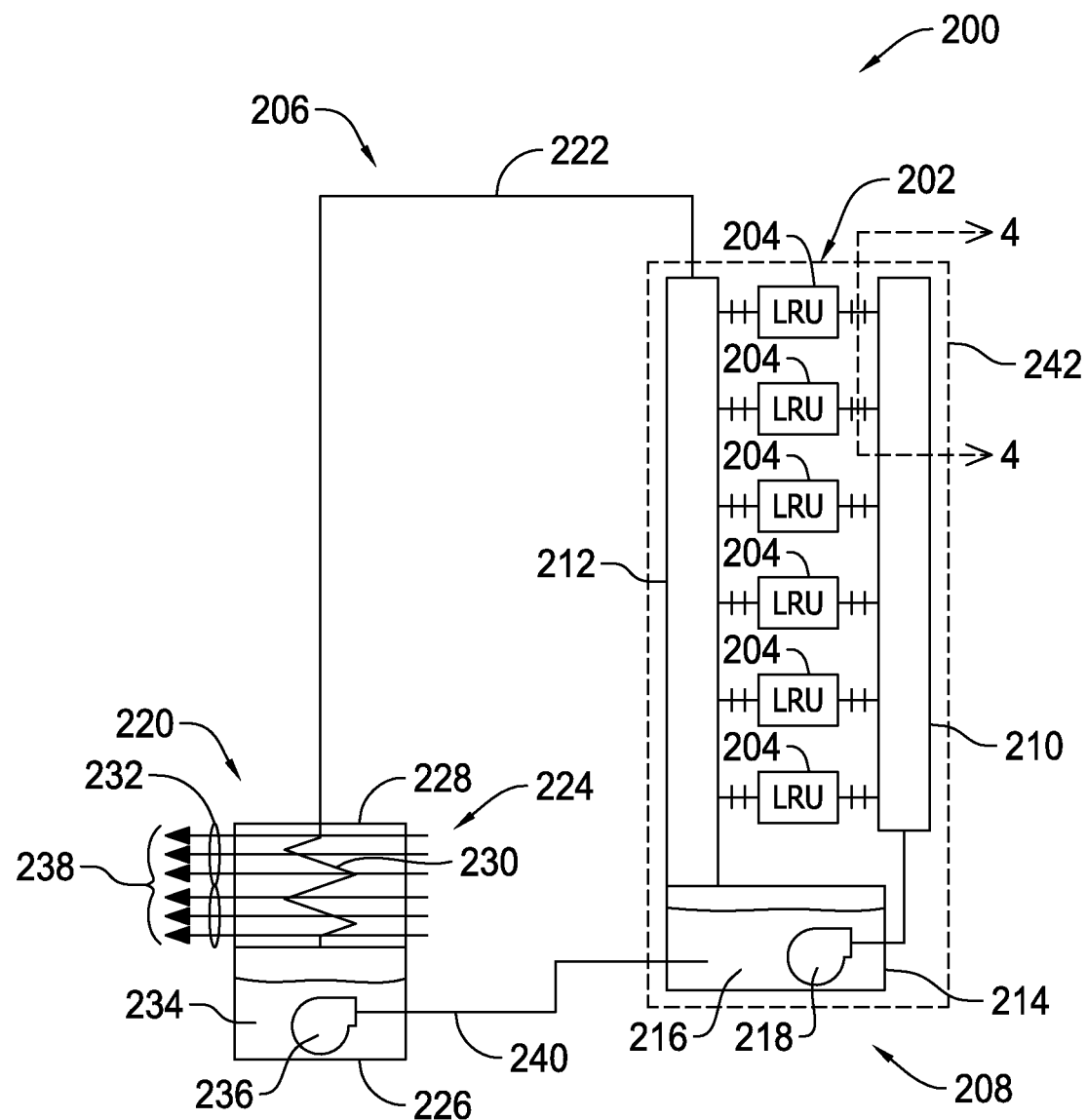
FIG. 3 is a schematic illustration of an exemplary power electronics assembly.

FIG. 3 is a schematic illustration of an exemplary power electronics assembly 200. In the exemplary implementation, power electronics assembly 200 includes an array 202 of line-replaceable units (LRUs) 204 and a cooling system 206 is coupled to array 202. Each LRU 204 generates heat when in operation, and cooling system 206 facilitates dissipating heat from array 202. Cooling system 206 includes a fluid supply 208, a first manifold 210 coupled in flow communication with fluid supply 208, and a second manifold 212 coupled in flow communication with fluid supply 208. First and second manifolds 210 and 212 are also coupled in flow communication with array 202 of LRUs 204. Specifically, first manifold 210 is coupled upstream from array 202, and second manifold 212 is coupled downstream from array 202. Moreover, fluid supply 208 includes a fluid reservoir 214 that stores an amount 216 of cooling fluid therein, and a first pump 218 at least partially submerged in amount 216 of cooling fluid.

The cooling fluid may be any cooling fluid that enables power electronics assembly 200 to function as described herein. For example, in one implementation, the cooling fluid has a temperature tolerance of greater than about 250° C., such as hydrofluoroether-based cooling fluids. Moreover, in an alternative implementation, cooling system 206 includes a filter coupled upstream from array 202. For example, the filter may be coupled between a condenser 220 and first manifold 210. The filter may be either a physical filter or a chemical filter that facilitates removing impurities from the cooling fluid before being discharged towards array 202.

In operation, fluid supply 208 channels cooling fluid towards first manifold 210 thereby discharging the cooling fluid towards each LRU 204 in array 202 substantially simultaneously. Specifically, first pump 218 discharges amount 216 of cooling fluid towards first manifold 210, first manifold 210 discharges the cooling fluid towards array 202, and second manifold 212 collects the cooling fluid discharged towards each LRU 204 in array 202. In some implementations, first manifold 210 includes a plurality of flow control orifices (not shown in FIG. 3), and discharges the cooling fluid at a flow rate and a pressure that atomizes the cooling fluid discharged towards each LRU 204. At least a portion of the cooling fluid vaporizes when contacting LRUs 204, and the latent heat of vaporization of the cooling fluid facilitates extracting heat from LRUs 204. As such, second manifold 212 collects a flow of vaporized cooling fluid and a flow of residual cooling fluid remaining in liquid form. The flow of residual liquid cooling fluid is separated from the vaporized cooling fluid, recycled towards fluid supply 208, and added to amount 216 of cooling fluid. The flow of vaporized cooling fluid and, in some implementations, a portion of residual cooling fluid is channeled towards condenser 220 via a return line 222 via a negative pressure in the closed loop system.

Condenser 220 may be any heat exchanger type device that enables cooling system to function as described herein. In the exemplary implementation, condenser 220 includes a heat exchanger 224 and a condenser reservoir 226 coupled to heat exchanger 224. Heat exchanger 224 includes a housing 228, a heat exchange conduit 230 extending through housing 228, and a fan 232 coupled in flow communication with housing 228. Condenser reservoir 226 includes an amount 234 of condensed cooling fluid, and a second pump 236 at least partially submerged in amount 234.

In operation, condenser 220 receives the flow of vaporized cooling fluid from second manifold 212 via return line 222. Return line 222 is coupled in flow communication with heat exchange conduit 230 such that the flow of vaporized cooling fluid is channeled therethrough. Moreover, return line 222 is sized to reduce sonic velocities, is compatible with condensed vapors, and includes insulation to reduce excess vapor condensation. Fan 232 operates such that a flow 238 of cooling airflow is drawn through housing 228, which cools the flow of vaporized cooling fluid. The flow of vaporized cooling fluid condenses and facilitates forming amount 234 of condensed cooling fluid. Second pump 236 then discharges amount 234 of condensed cooling fluid towards fluid supply 208 via a supply line 240. As such, in some implementations, condenser 220 operates to substantially continuously replenish amount 216 of cooling fluid in fluid reservoir 214.

In an alternative implementation, first and second manifolds 210 and 212, array 202, and fluid supply 208 define an equipment rack 242. In such an implementation, multiple equipment racks 242 may be coupled in parallel with a single condenser 220. As such, the flow of vaporized cooling fluid and the portion of residual cooling fluid from each second manifold 212 of the multiple equipment racks 242 are channeled towards the single condenser 220. Condenser 220 can then selectively replenish the cooling fluid in each fluid reservoir 214 of the multiple equipment racks 242 via a series of valves coupled along supply lines 240.

Figure 4:
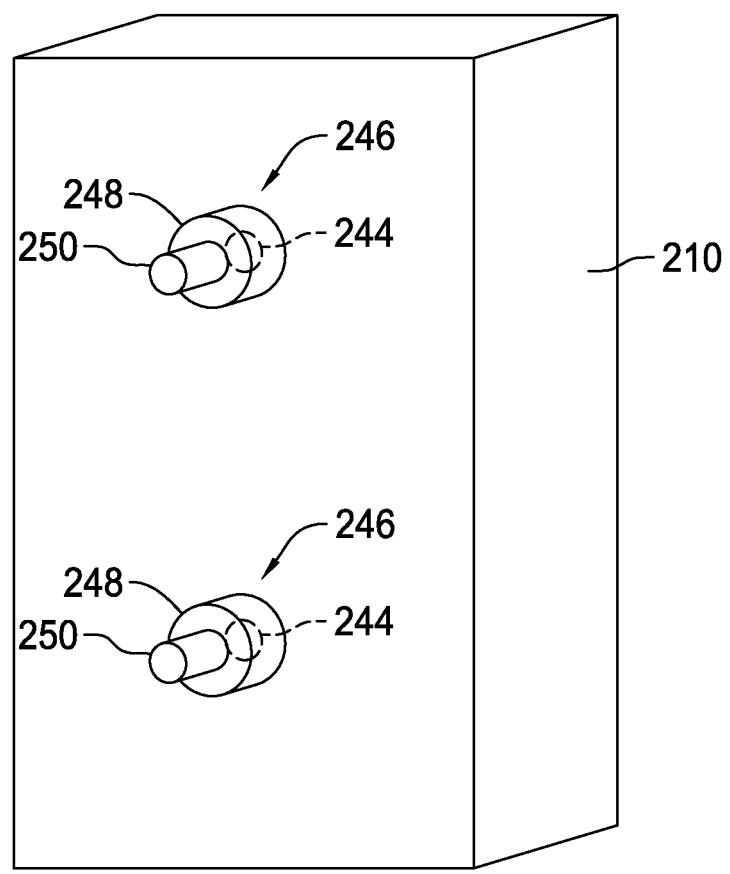
FIG. 4 is a perspective schematic illustration of an exemplary manifold that may be used with the cooling system shown in FIG. 3 taken along Line 4-4.

FIG. 4 is a perspective schematic illustration of first manifold 210 taken along Line 4-4 (shown in FIG. 3). In the exemplary implementation, a plurality of flow control orifices 244 are defined in first manifold 210. Flow control orifices 244 facilitate coupling first manifold 210 in flow communication with array 202 of LRUs 204 (each shown in FIG. 3) such that cooling fluid can be discharged from first manifold 210 towards LRUs 204. For example, at least one flow control orifice 244 is substantially aligned with each LRU 204. Moreover, each flow control orifice 244 substantially aligned with respective LRUs 204 is sized based on a heat load generated by each LRU 204. Specifically, flow control orifices 244 are sized such that a flow rate of cooling fluid discharged therefrom is selected based on a heat load generated by LRUs 204 substantially aligned with each flow control orifice 244.

For example, greater sized flow control orifices 244 are substantially aligned with LRUs 204 that generate more heat, and smaller sized flow control orifices 244 are substantially aligned with LRUs 204 that generate less heat. Moreover, for example, for an exemplary LRU 204 requiring a heat dissipation load of 3.5 kiloWatts (199.22 BTU/minute), the calculation of the required water coolant flow rate (given heat of vaporization of water of 2260 kiloJoules/kiligram) would be 0.0000929 cubic meters/minute (0.0246 gallons/minute), from which a required exemplary orifice size of 1.32 centimeters (0.52 inches) may be calculated, for a first manifold pressure of 2.82 kilograms/square centimeter (40 pounds/square inch) and a pressure drop of 2.985 kilopascals (0.433 pounds/square inch). As such, cooling fluid is discharged from first manifold 210 at different flow rates even when a flow rate of cooling fluid channeled towards first manifold 210 from fluid supply 208 (shown in FIG. 3) is substantially constant.

Cooling system 206 also includes a self-sealing connector 246 coupled between first and second manifolds 210 and 212, and each LRU 204 in array 202 such that each LRU 204 is selectively uncouplable from first and second manifolds 210 and 212. The connections between each LRU 204 and first and second manifolds 210 and 212 are designed to reduce leakage, while enabling LRU removal and replacement without losses in system pressure. This function should be completed while ensuring excess pressure penalty to pump 218 is avoided, and ensuring exhaust of hot vapor/liquid flow from LRUs 204 is not obstructed.

Referring to FIG. 4, each self-sealing connector 246 includes a receptor portion 248 coupled to first manifold 210, and an insertion portion 250 coupled on opposing sides of each LRU 204. When LRU 204 is coupled between first and second manifolds 210 and 212, insertion portion 250 is received within receptor portion 248 and cooling fluid discharge from first manifold 210 is enabled. When LRU 204 is uncoupled from first and second manifolds 210 and 212, insertion portion 250 is uncoupled from receptor portion 248 and receptor portion 248 self-seals via a valve (not shown), for example, such that cooling fluid discharge from first manifold 210 is disabled. As such, LRUs 204 are quickly and easily removable from array 202, and interchangeable with a replacement LRU.

The systems and methods described herein relate to power electronics assemblies and systems for dissipating heat therefrom. Specifically, the power electronics assembly includes an array of line-replaceable units (LRUs) that generate heat during operation thereof The cooling system for the array is a centralized assembly such that each LRU does not have its own self-contained cooling system. More specifically, the cooling system described herein includes a first manifold that enables cooling fluid to be discharged towards each LRU in the array substantially simultaneously, a second manifold that collects the cooling fluid discharged towards each LRU, and a single pump that channels cooling fluid towards the first manifold. An amount of cooling fluid discharged towards each LRU is selected as a function of a size of flow control orifices defines in the first manifold. As such, the systems and methods described herein provide a centralized cooling system that facilitates simplifying an arrangement of the cooling equipment, and that facilitates reducing the weight of an overall system incorporating the centralized cooling system.

This written description uses examples to disclose various implementations, including the best mode, and also to enable any person skilled in the art to practice the various implementations, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A cooling system for use in a vehicle with a power electronics assembly comprising a plurality of equipment racks, each equipment rack of the plurality of equipment racks including an array of line-replaceable units, said cooling system comprising:

a first manifold coupled in flow communication with the array of line-replaceable units of each equipment rack, said first manifold comprising a plurality of flow control orifices that comprises at least a first flow control orifice and a second flow control orifice;

a fluid supply positioned within each equipment rack below the array of line-replaceable units and coupled in flow communication with said first manifold, said fluid supply comprising a first reservoir for storing cooling fluid in liquid form and a first pump configured to channel the cooling fluid from said first reservoir towards said first manifold such that a first stream of cooling fluid is discharged from said first flow control orifice and such that a second stream of cooling fluid is discharged from said second flow control orifice towards the line-replaceable units in the array simultaneously, wherein said first flow control orifice and said second flow control orifice are sized differently such that the first stream of cooling fluid is discharged at a different flow rate than the second stream of cooling fluid, wherein at least a portion of the first and second streams of cooling fluid is vaporized upon contacting the line-replaceable units, wherein said first manifold discharges the cooling fluid at a flow rate and a pressure that atomizes the cooling fluid discharged towards the line-replaceable units;

a second manifold coupled in flow communication with the array of line-replaceable units of each equipment rack, wherein said second manifold is configured to collect the cooling fluid discharged to each line-replaceable unit where a portion of the cooling fluid to the line-replaceable unit vaporizes when contacting the line-replaceable unit, such that the line replaceable unit provides an unseparated flow of vaporized cooling fluid and liquid cooling fluid that is received by the second manifold, and the second manifold is configured to separate the vaporized portion of the cooling fluid from a liquid portion of the cooling fluid, and wherein said second manifold is further configured to recycle the liquid portion of the cooling fluid into the first reservoir;

a return line coupled to a top portion of said second manifold and configured to receive and channel the vaporized portion of the cooling fluid, wherein said return line is sized to reduce sonic velocities of the vaporized portion of the cooling fluid within said return line; and a centralized condenser positioned remotely from and fluidly coupled to the plurality of equipment racks, said centralized condenser configured to receive the vaporized portion of the cooling fluid from each equipment rack via said return line, said centralized condenser comprising:

a housing comprising a conduit configured to channel the vaporized portion of the cooling fluid therethrough to condense the vaporized cooling fluid into a condensed cooling fluid, a second reservoir for receiving and storing the condensed cooling fluid, and a second pump configured to channel the condensed cooling fluid to said first reservoir of each equipment rack via a supply line; and a fan coupled to said housing and configured to:

draw a flow of air through said housing and across said conduit to condense the vaporized portion of the cooling fluid into the condensed cooling fluid; and discharge the flow of air from the vehicle to prevent an increase in ambient temperature surrounding the array in the vehicle.

2. The system in accordance with claim 1, wherein at least one of said plurality offlow control orifices aligns with each line-replaceable unit in the array.

3. The system in accordance with claim 2, wherein said plurality of flow control orifices are sized at least in part based on a heat load generated by the line-replaceable units.

4. The system in accordance with claim 3 wherein said condenser is coupled in flow communication with said second manifold receives the vaporized portion of the cooling fluid from said second manifold.

5. A power electronics assembly for use in a vehicle, said power electronics assembly comprising:

a plurality of equipment racks, each equipment rack of the plurality of equipment racks including an array of line-replaceable units; and a cooling system comprising:

a first manifold coupled in flow communication with said array of line-replaceable units of each equipment rack;

a fluid supply positioned within each equipment rack below the array of line-replaceable units and coupled in flow communication with said first manifold, said fluid supply comprising a first reservoir for storing cooling fluid in liquid form and a first pump configured to channel the cooling fluid from said first reservoir towards said first manifold such that the cooling fluid is discharged towards the line-replaceable units in the array simultaneously, wherein at least a portion of the cooling fluid is vaporized upon contacting the line-replaceable units, wherein said first manifold discharges the cooling fluid at a flow rate and a pressure that atomizes the cooling fluid discharged towards the line-replaceable units;

a second manifold coupled in flow communication with the array of line-replaceable units of each equipment rack, wherein said second manifold is configured to collect the cooling fluid discharged to each line-replaceable unit where a portion of the cooling fluid to the line-replaceable unit vaporizes when contacting the line-replaceable unit, such that the line replaceable unit provides an unseparated flow of vaporized cooling fluid and liquid cooling fluid that is received by the second manifold, and the second manifold is configured to separate the vaporized portion of the cooling fluid from a liquid portion of the cooling fluid, and wherein said second manifold is further configured to recycle the liquid portion of the cooling fluid into the first reservoir;

a return line coupled to a top portion of said second manifold and configured to receive and channel the vaporized portion of the cooling fluid, wherein said return line is sized to reduce sonic velocities of the vaporized portion of the cooling fluid within said return line; and a centralized condenser positioned remotely from and fluidly coupled to the plurality of equipment racks, said centralized condenser configured to receive the vaporized portion of the cooling fluid from each equipment rack via said return line, said centralized condenser comprising:

a housing comprising a conduit configured to channel the vaporized portion of the cooling fluid therethrough to condense the vaporized portion of the cooling fluid into a condensed cooling fluid, a second reservoir for receiving and storing the condensed cooling fluid, and a second pump configured to channel the condensed cooling fluid to said first reservoir of each equipment rack via a supply line; and a fan coupled to said housing and configured to:

draw a flow of air through said housing and across said conduit to condense the vaporized portion of the cooling fluid into the condensed cooling fluid; and discharge the flow of air from the vehicle to prevent an increase in ambient temperature surrounding the array in the vehicle.

6. The assembly in accordance with claim 5 further comprising a self-sealing connector coupled between said first manifold and the line-replaceable units in the array such that each line-replaceable unit is selectively uncouplable from said first manifold.

7. The assembly in accordance with claim 5, further comprising a plurality of flow control orifices defined in said first manifold, wherein at least one of said plurality of flow control orifices aligns with each line-replaceable unit in the array.

8. The assembly in accordance with claim 7 wherein said condenser is coupled in flow communication with said second manifold and receives the vaporized portion of the cooling fluid from said second manifold.

9. A method of manufacturing a cooling system for use in a vehicle with a power electronics assembly comprising a plurality of equipment racks, each equipment rack of the plurality of equipment racks including an array of line-replaceable units, said method comprising:

coupling a first manifold in flow communication with the array of line-replaceable units of each equipment rack;

defining a plurality of flow control orifices in the first manifold, the plurality of flow control orifices including at least a first flow control orifice and a second flow control orifice;

coupling a fluid supply in flow communication with the first manifold, the fluid supply positioned within each equipment rack below the array of line-replaceable units, the fluid supply including a first reservoir for storing cooling fluid in liquid form and a first pump configured to channel the cooling fluid from the first reservoir towards the first manifold such that a first stream of cooling fluid is discharged from the first flow control orifice and such that a second stream of cooling fluid is discharged from the second flow control orifice towards the line-replaceable units in the array simultaneously, wherein the first flow control orifice and the second flow control orifice are sized differently such that the first stream of cooling fluid is discharged at a greater flow rate than the second stream of cooling fluid, wherein at least a portion of the first and second streams of cooling fluid is vaporized upon contacting the line-replaceable units, wherein the first manifold discharges the cooling fluid at a flow rate and a pressure that atomizes the cooling fluid discharged towards the line-replaceable units;

coupling a second manifold in flow communication with the array of line-replaceable units of each equipment rack, wherein the second manifold is configured to collect the cooling fluid discharged to each line-replaceable unit where a portion of the cooling fluid to the line-replaceable unit vaporizes when contacting the line-replaceable unit, such that the line replaceable unit provides an unseparated flow of vaporized cooling fluid and liquid cooling fluid that is received by the second manifold, and the second manifold is configured to separate the vaporized portion of the cooling fluid from a liquid portion of the cooling fluid, and wherein the second manifold is further configured to recycle the liquid portion of the cooling fluid into the first reservoir;

receiving, by a return line coupled to a top portion of the second manifold and having a negative pressure generated therein, the vaporized portion of cooling fluid, wherein the return line is sized to reduce sonic velocities of the vaporized portion of the cooling fluid within the return line; and channeling, to a centralized condenser via the return line, the vaporized portion of the cooling fluid into a conduit positioned within a housing of the centralized condenser, wherein the centralized condenser is positioned remotely from and fluidly coupled to the plurality of equipment racks;

drawing, using a fan coupled to the housing, a flow of air through the housing and across the conduit to condense the vaporized portion of the cooling fluid into a condensed cooling fluid;

receiving and storing, by a second reservoir positioned in the housing, the condensed cooling fluid;

channeling, by a second pump positioned in the housing, the condensed cooling fluid to the first reservoir of each equipment rack via a supply line;

discharging the flow of air from the vehicle to prevent an increase in ambient temperature surrounding the array in the vehicle.

10. The method in accordance with claim 9, wherein defining a plurality of flow control orifices in the first manifold comprises aligning at least one of the plurality of flow control orifices with each line-replaceable unit in the array.

11. The method in accordance with claim 10 further comprising coupling the condenser in flow communication with the fluid supply, wherein the condenser channels the condensed cooling fluid towards the fluid supply.

12. The system in accordance with claim 1 in combination with an aircraft.

13. The method in accordance with claim 9, wherein the vehicle is an aircraft.

14. The assembly in accordance with claim 7, wherein said plurality of flow control orifices are sized at least in part based on a heat load generated by the line-replaceable units.

15. The method in accordance with claim 10, wherein the plurality of flow control orifices are sized at least in part based on a heat load generated by the line-replaceable units.

16. The system in accordance with claim 1 further comprising a self-sealing connector coupled between said first manifold and the line-replaceable units in the array such that each line-replaceable unit is selectively uncouplable from said first manifold.

17. The method in accordance with claim 9 further comprising coupling a self-sealing connector between the first manifold and the line-replaceable units in the array such that each line-replaceable unit is selectively uncouplable from the first manifold.

18. The method in accordance with claim 17 further comprising uncoupling the self-sealing connector between the first manifold and the line-replaceable units in the array such that at least one line-replaceable unit is uncoupled from the first manifold.

19. The method in accordance with claim 18 further comprising recoupling the self-sealing connector between the first manifold and the line-replaceable units in the array such that at least one line-replaceable unit is recoupled to the first manifold.

20. The assembly in accordance with claim 5, wherein the vehicle is an aircraft.

* * * * *

UNITED STATES PATENT AND TRADEMARK OFFICE
CERTIFICATE OF CORRECTION

| | |
|---|---|
| PATENT NO. | : 10,576,589 B2 |
| APPLICATION NO. | : 14/501683 |
| DATED | : March 3, 2020 |
| INVENTOR(S) | : Charles E. Kusuda |

It is certified that error appears in the above-identified patent and that said Letters Patent is hereby corrected as shown below:

In the Claims

In Column 7, Line 26, delete "offlow" and insert therefor -- of flow --.

Signed and Sealed this
Thirteenth Day of October, 2020

Andrei Iancu
*Director of the United States Patent and Trademark Office*